(12) United States Patent
Vuylsteke et al.

(10) Patent No.: US 11,233,342 B2
(45) Date of Patent: Jan. 25, 2022

(54) FASTENING FLAT CONDUCTOR IN AN ELECTRICAL ASSEMBLY

(71) Applicant: FORD GLOBAL TECHNOLOGIES, LLC, Dearborn, MI (US)

(72) Inventors: Gabrielle Elizabeth Moilanen Vuylsteke, Ann Arbor, MI (US); David Jeffeory Berels, Plymouth, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 113 days.

(21) Appl. No.: 16/531,418

(22) Filed: Aug. 5, 2019

(65) Prior Publication Data

US 2021/0044032 A1 Feb. 11, 2021

(51) Int. Cl.
| | |
|---|---|
| *H01R 12/00* | (2006.01) |
| *H05K 1/00* | (2006.01) |
| *H01R 4/38* | (2006.01) |
| *H01R 13/62* | (2006.01) |
| *H05K 1/11* | (2006.01) |
| *G03G 15/08* | (2006.01) |
| *H01R 4/2408* | (2018.01) |
| *H01R 4/06* | (2006.01) |
| *H01R 9/20* | (2006.01) |
| *H05K 3/42* | (2006.01) |
| *H05K 3/36* | (2006.01) |
| *H01R 12/62* | (2011.01) |
| *G03G 5/087* | (2006.01) |

(52) U.S. Cl.
CPC .............. *H01R 4/2408* (2013.01); *H01R 4/06* (2013.01); *H01R 9/20* (2013.01); *H05K 3/429* (2013.01); *G03G 5/087* (2013.01); *H01R 12/62* (2013.01); *H05K 1/112* (2013.01); *H05K 3/365* (2013.01)

(58) Field of Classification Search
CPC .................................. H01R 9/20; H01R 4/06
USPC ....... 430/84, 883, 908; 174/262; 439/67, 69, 439/82, 329
See application file for complete search history.

(56) References Cited

U.S. PATENT DOCUMENTS

| | | | | |
|---|---|---|---|---|
| 3,148,310 A | * | 9/1964 | Feldman ................. | H05K 1/112 174/265 |
| 3,646,246 A | * | 2/1972 | Olney, Jr. .............. | H05K 3/222 174/251 |
| 3,872,236 A | * | 3/1975 | Swengel, Sr. .......... | H05K 3/222 174/251 |

(Continued)

FOREIGN PATENT DOCUMENTS

| | | |
|---|---|---|
| FR | 2826518 A1 | 12/2002 |
| GB | 1177275 A | 1/1970 |

(Continued)

*Primary Examiner* — Abdullah A Riyami
*Assistant Examiner* — Thang H Nguyen
(74) *Attorney, Agent, or Firm* — Frank L. Lollo; MacMillan, Sobanski & Todd, LLC

(57) ABSTRACT

An electrical assembly that includes a substrate having an aperture. A flat conductor is mounted to the substrate and extends over at least a portion of the aperture, with a ring terminal in contact with the flat conductor adjacent to the aperture. A lead wire connects to the ring terminal and is spaced from the substrate, and a fastener extends through the ring terminal and flat conductor, secured in the aperture, and securing the ring terminal against the flat conductor.

10 Claims, 5 Drawing Sheets

(56) References Cited

U.S. PATENT DOCUMENTS

| | | | | | |
|---|---|---|---|---|---|
| 4,186,982 | A | * | 2/1980 | Cobaugh | H01R 12/58 439/444 |
| 4,220,393 | A | * | 9/1980 | Ammon | H01R 12/585 439/682 |
| 4,362,351 | A | * | 12/1982 | Wible | H01R 4/302 439/738 |
| 4,522,211 | A | * | 6/1985 | Bare | A61B 5/259 600/392 |
| 4,674,811 | A | * | 6/1987 | Corwin | H05K 7/1007 439/259 |
| 5,254,016 | A | * | 10/1993 | Ganthier | H01R 12/714 411/339 |
| 5,759,047 | A | * | 6/1998 | Brodsky | H01L 23/49811 439/66 |
| 5,764,485 | A | * | 6/1998 | Lebaschi | H05K 1/113 361/774 |
| 6,036,502 | A | * | 3/2000 | Neidich | H01R 12/7047 439/67 |
| 6,066,889 | A | * | 5/2000 | Jones | H01L 21/486 174/262 |
| 6,204,456 | B1 | * | 3/2001 | Lauffer | H05K 3/0094 174/262 |
| 6,271,482 | B1 | * | 8/2001 | Crotzer | H01H 1/029 174/262 |
| 6,611,429 | B2 | * | 8/2003 | Kline | H05K 9/0039 174/51 |
| 6,641,408 | B1 | * | 11/2003 | Svenkeson | H01R 12/721 439/67 |
| 6,842,976 | B2 | * | 1/2005 | Enomoto | H01R 12/67 29/432.1 |
| 7,692,933 | B1 | * | 4/2010 | Mueller | H05K 7/142 361/804 |
| 7,990,715 | B2 | * | 8/2011 | Chen | H01L 23/4093 361/709 |
| 2005/0207114 | A1 | * | 9/2005 | Gall | H05K 5/0213 361/690 |
| 2005/0231927 | A1 | * | 10/2005 | Masuyama | H05K 1/115 361/783 |
| 2015/0138742 | A1 | * | 5/2015 | Nguyen | H05K 1/113 361/767 |
| 2016/0156115 | A1 | * | 6/2016 | Feye-Hohmann | H01R 12/58 439/84 |
| 2016/0230800 | A1 | * | 8/2016 | Sawai | F16B 37/04 |
| 2016/0377951 | A1 | * | 12/2016 | Harris | G02F 1/167 359/296 |

FOREIGN PATENT DOCUMENTS

| | | |
|---|---|---|
| JP | 2004311268 A | 11/2004 |
| JP | 2007087960 A | 4/2007 |
| JP | 4751591 B2 | 8/2011 |

\* cited by examiner

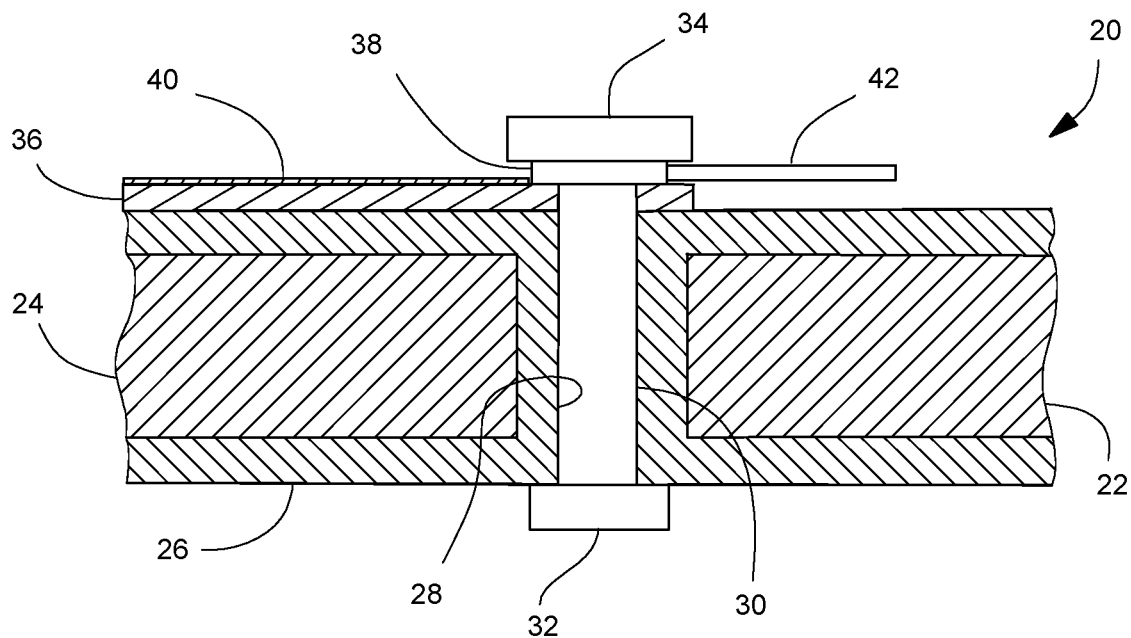
Fig. 1
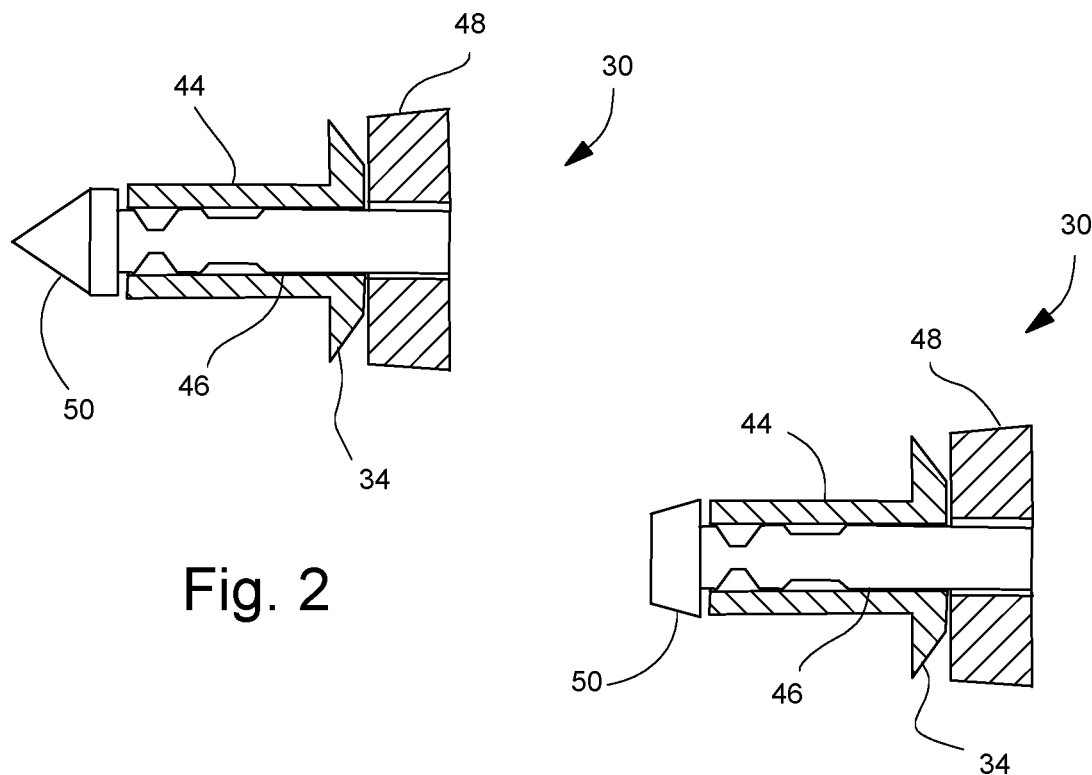
Fig. 2
Fig. 3

FASTENING FLAT CONDUCTOR IN AN ELECTRICAL ASSEMBLY

BACKGROUND OF THE INVENTION

The present invention relates to connecting lead wires to a trace or flat conductor on a substrate in an electrical assembly.

Flat conductors, such as for example conductive copper tape and printed or painted circuits, may be beneficial due to the low profile and improved packaging of the conductors. When employing flat conductors, efficient and cost effective connection methods between the flat conductors and traditional cylindrical wires may be needed in particular assemblies.

SUMMARY OF THE INVENTION

An embodiment contemplates an electrical assembly including a substrate having an aperture; a flat conductor mounted to the substrate and extending over at least a portion of the aperture; a ring terminal in contact with the flat conductor adjacent to the aperture; a lead wire connected to the ring terminal and spaced from the substrate; and a fastener extending through the ring terminal and flat conductor, secured in the aperture, and securing the ring terminal against the flat conductor.

An embodiment contemplates a method of forming an electrical assembly comprising: creating an aperture in a substrate; mounting a flat conductor to the substrate extending over at least a portion of the aperture; connecting a round lead wire to a ring terminal; mounting the ring terminal against the flat conductor adjacent to the aperture; sliding a fastener through the ring terminal and flat conductor; and securing the fastener in the aperture such that the ring terminal is secured against the flat conductor.

An embodiment contemplates an electrical assembly comprising: a substrate having an aperture; a flat conductor mounted to the substrate; a terminal in contact with the flat conductor adjacent to the aperture; a round lead wire connected to the terminal; and a fastener secured in the aperture, securing the terminal against the flat conductor.

An advantage of an embodiment is relatively easy, cost effective and space efficient transitions from flat conductors, such as conductive copper tape and printed/painted circuits, to cylindrical wires. These transitions allow for straight forward assembly with a small number of components, while preventing unintended electrical connections or shorting.

BRIEF DESCRIPTION OF THE DRAWINGS

FIG. 1 is a schematic, partial cross section view through a portion of an electrical assembly.

FIG. 2 is a schematic, partial cross section view through a portion of an electrical assembly.

FIG. 3 is a schematic, partial cross section view through a portion of an electrical assembly.

DETAILED DESCRIPTION

Figure 4:
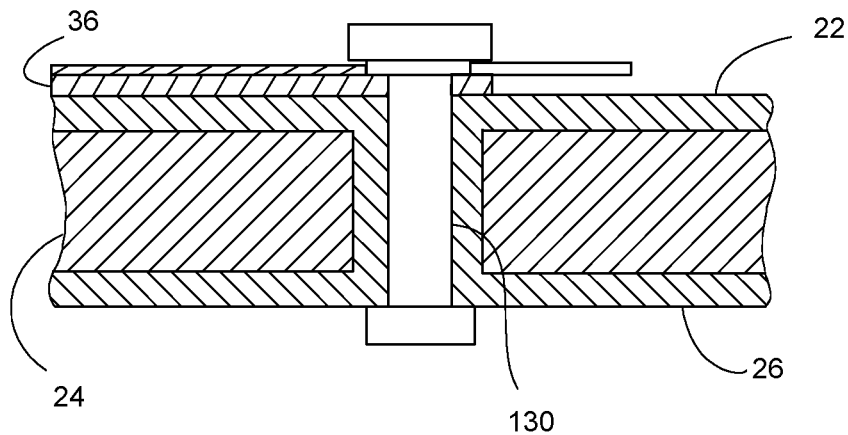
FIG. 4 is a schematic, partial cross section view through a portion of an electrical assembly, according to another embodiment.

FIG. 1 illustrates a schematic, partial cross section view through a portion of an electrical assembly 20. The electrical assembly 20 is formed on a substrate 22, which may be for example a vehicle body 24, made of for example steel or aluminum, coated in paint 26. The substrate 22 is formed with a hole 28 for securing the electrical assembly 20 to the substrate 22.

The electrical assembly 20 has fastening member, such as a rivet 30, which may be metal, extending through and secured in the hole 28. The rivet 30 has a first head 32 that secures one side of the rivet 30 in the hole 28 and a second head 34 that not only secures the other end of the rivet 30 in the hole 28, but also secures an electrical connection between elements of the electrical assembly 20.

Secured together under the second head 34 are a conductive trace (or flat conductor) 36 and a ring terminal 38. The conductive trace 36 may be mounted on (secured to) the substrate 22, with an electrically insulating coating 40 covering the conductive trace 36 up to the edge of the ring terminal 38. The ring terminal 38 is connected to an insulated conductive wire (lead wire) 42. Thus, there is a secure electrical connection between the conductive trace 36 and the lead wire 42, which may be a conventional round wire.

The assembly of the electrical assembly 20 will now be discussed. The body 24 of the substrate 22 may be formed with the hole 28 or the hole 28 may be formed after the forming of the body 24. The body 24 may then be coated with paint 26. The conductive trace 36 may be applied to the paint 26 portion of the substrate 22, with an end of the conductive trace 36 overlapping over the top of the hole 28. The ring terminal 38, which may be already connected to the lead wire 42, is located adjacent to and in contact with the conductive trace 36, with an opening in the ring terminal 38 centered over the hole 28. The rivet 30 is then inserted through the ring terminal 38, punched through the conductive trace 36 (forming a hole in the trace during the punching action), and then slid through the hole 28. The rivet 30 is then secured in the hole 28, with the conductive trace 36 and the ring terminal 36 secured under the second head 34. The electrically insulating coating 40 may then be applied over the conductive trace 36.

Thus, the electrical connection is securely made while protecting the electrical assembly 20 with insulation where desired in order to prevent unintended electrical connections or shorting.

FIGS. 2 and 3 illustrate two possible rivets 30 that may be employed in the electrical assembly 20 of FIG. 1. The rivet 30 includes a rivet body 44 having the second head 34 at one end and at the opposed end of the body 44, the location where the first head 32 will be formed. A mandrel 46 extends through the rivet body 44, with a tool 48 at a first end, which is used to secure the rivet 30, and a mandrel head 50 extending from the rivet body 44 at an opposed end from the tool 48. The mandrel head 50 may be pointed (such as a conical shape), which allows the rivet 30 to pierce through the conductive trace 36 (see FIG. 1) easier during assembly of the electrical assembly 20. After piercing through, the tool 48 may be manipulated to cause the mandrel head 50 to crush a portion of the rivet body 44, thus forming the first head 32. In FIG. 3, the rivet 30 and assembly is essentially the same, except that the mandrel head 50 is shaped as a sharp-edged punch, which also eases the punching of the mandrel head 50 through the conductive trace 36 (see FIG. 1).

FIG. 4 illustrates an alternate embodiment of FIG. 1. The assembly described in FIG. 4 has many items in common with that of FIG. 1 and so to avoid unnecessary repetition of the description the same reference numbers have been used; for those modified components, they are given a 100-series number. If one is concerned that there may possibly be unintended electrical conduction through the metal rivet and paint 26 to the body 24 of the substrate 22, then the rivet (fastening member) 130 may be made of an electrically insulating material, such as plastic. The rivet 130 may still be punched through the conductive trace 36 the same as FIG. 1.

Figure 5:
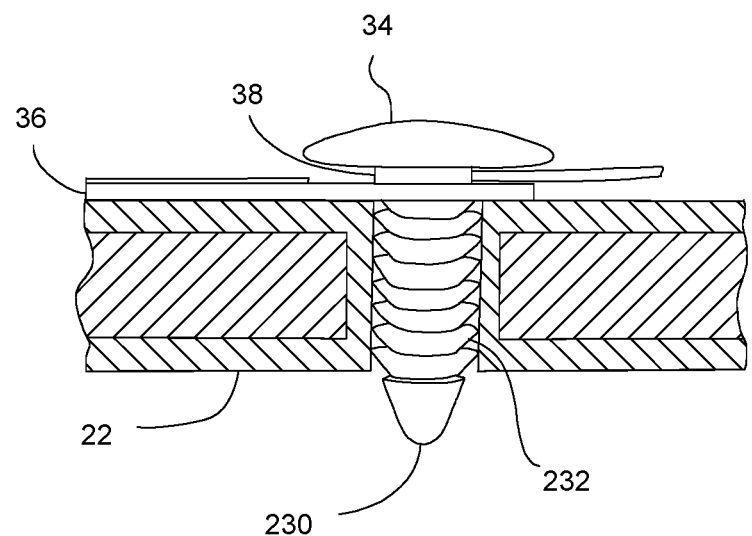
FIG. 5 is a schematic, partial cross section view through a portion of an electrical assembly, according to another embodiment.

FIG. 5 illustrates another alternate embodiment of FIGS. 1 and 4. The assembly described in FIG. 5 has many items in common with that of FIG. 1 and so to avoid unnecessary repetition of the description the same reference numbers have been used; for those modified components, they are given a 200-series number. In this embodiment, a push pin 230 may be employed instead of a rivet. This push pin 230 may be made of plastic and may include a series of barbs 232 that secures the push pin 230 in to substrate 22 rather than a first rivet head. The conductive trace 36 and ring terminal 38 are still secured together under the second head 34 of the fastening member 230. The push pin 230 may still be punched through the conductive trace 36 the same as FIG. 1.

Figure 6:
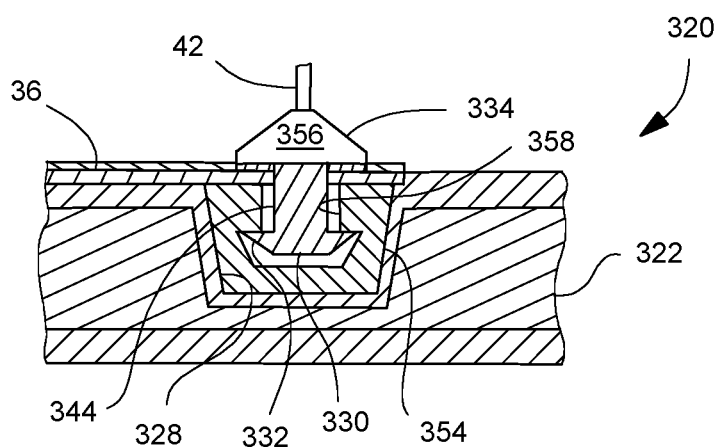
FIG. 6 is a schematic, partial cross section view through a portion of an electrical assembly, according to another embodiment.

FIG. 6 illustrates another alternate embodiment of FIG. 5. The assembly described in FIG. 6 has many items in common with that of FIG. 1 and so to avoid unnecessary repetition of the description that same reference numbers have been used; for those modified components, they are given a 300-series number. In this embodiment, the substrate 322 includes an anchor recess 328, within which is mounted an anchor 354, which may be electrically insulating. The anchor recess 328 replaces the hole 28 (see FIG. 1). The anchor 354 is secured in the recess 328, for example, with adhesive, a press fit or a clip. The conductive trace 36 is applied to the substrate 322 and anchor 354 over the anchor recess 328. A push pin 330 may include an electrically conductive shaft 344 and barb 332, and a second head 334 having an electrically insulated coating 356. The lead wire 42 connects through the second head 334 to the electrically conductive shaft 344 (alternatively, the lead wire 42 may connect to a ring terminal 38 (see FIGS. 1 and 10) that is secured under the second head 334). The barb 332 and shaft 344 may be punched through the conductive trace 36 or slid through a hole that is already formed in the conductive trace 36, and then slid through a cavity 358 in the anchor 354, at which point the barb 332 engages the cavity 358 to secure the push pin 330 to the substrate 322. In this way the conductive trace 36 is electrically connected to the lead wire 42 while insulating the electrical assembly 320 from shorting with the substrate 322 or other components.

Figure 7:
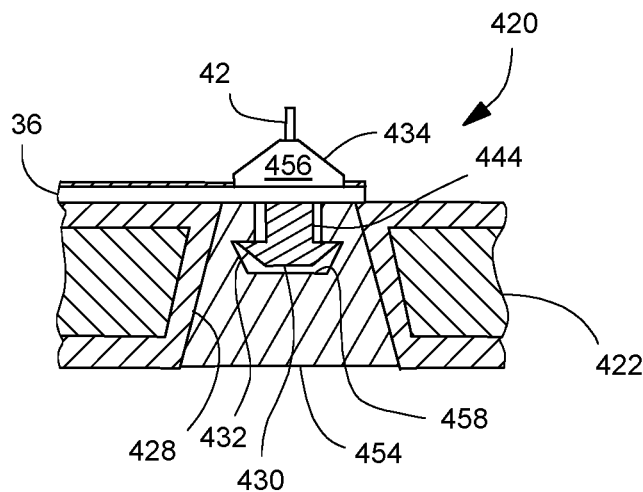
FIG. 7 is a schematic, partial cross section view through a portion of an electrical assembly, according to another embodiment.

FIG. 7 illustrates an alternate embodiment of FIG. 6. The assembly described in FIG. 7 has many items in common with that of FIG. 6 and so to avoid unnecessary repetition of the description that same reference numbers have been used; for those modified components, they are given a 400-series number. In this embodiment, the substrate 422 includes a hole 428, similar to the hole in FIGS. 1, 4 and 5, but conically tapered as the hole 428 extends away from the location of the conductive trace 36. An anchor 454, which may be electrically insulating, is mounted in the hole 428 and secured in the hole 428, for example, with adhesive, a press fit or a clip. The conductive trace 36 is applied to the substrate 422 and anchor 454 over the anchor hole 428. A push pin 430 may include an electrically conductive shaft 444 and barb 432, and a second head 434 having an electrically insulated coating 456. The lead wire 42 connects through the second head 434 to the electrically conductive shaft 444 (alternatively, the lead wire 42 may connect to a ring terminal 38 (see FIG. 1) that is secured under the second head 434). The barb 432 and shaft 444 may be punched through the conductive trace 36 or slid through a hole that is already formed in the conductive trace 36, and then slid through a cavity 458 in the anchor 454, at which point the barb 432 engages the cavity 458 to secure the push pin 430 to the substrate 422. In this way the conductive trace 36 is electrically connected to the lead wire 42 while insulating the electrical assembly 420 from shorting with the substrate 422 or other components.

Figure 8:
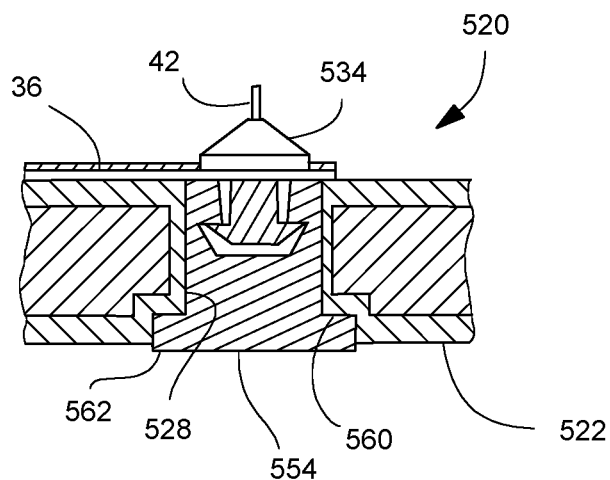
FIG. 8 is a schematic, partial cross section view through a portion of an electrical assembly, according to another embodiment.

FIG. 8 illustrates an alternate embodiment of FIG. 7. The assembly described in FIG. 8 has many items in common with that of FIG. 7 and so to avoid unnecessary repetition of the description that same reference numbers have been used; for those modified components, they are given a 500-series number. In this embodiment, the substrate 522 includes a hole 528, similar to the hole in FIG. 7, but cylindrical as the hole 528 extends away from the location of the conductive trace 36, with a notch 560 in the substrate 522 at an opposed end from the trace 36 where a head 562 of the anchor 554 is seated. The rest of the electrical assembly 520 may be the same as in FIG. 7. Again, alternatively, the lead wire 42 may connect to a ring terminal 38 (see FIG. 1) that is secured under the second head 534.

Figure 9:
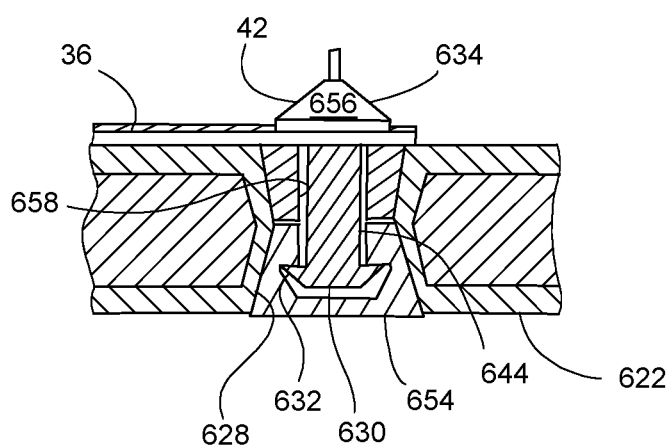
FIG. 9 is a schematic, partial cross section view through a portion of an electrical assembly, according to another embodiment.

FIG. 9 illustrates an alternate embodiment of FIG. 7. The assembly described in FIG. 9 has many items in common with that of FIG. 7 and so to avoid unnecessary repetition of the description that same reference numbers have been used; for those modified components, they are given a 600-series number. In this embodiment, the substrate 622 includes a hole 628, similar to the hole in FIG. 7, but with back to back conical walls, first narrowing and then widening. The anchor 654 is a two piece assembly with an outside surface that matches the shape of the hole 628. A push pin 630 may include an electrically conductive shaft 644 and barb 632, and a second head 634 having an electrically insulated coating 656. The lead wire 42 connects through the second head 634 to the electrically conductive shaft 644 (alternatively, the lead wire 42 may connect to a ring terminal 38 (see FIG. 1) that is secured under the second head 634). The barb 632 and shaft 644 may be punched through the conductive trace 36 or slid through a hole that is already formed in the conductive trace 36, and then slid through a cavity 658 in the anchor 654, at which point the barb 632 engages the cavity 658 to secure the push pin 630 to the substrate 622.

Figure 10:
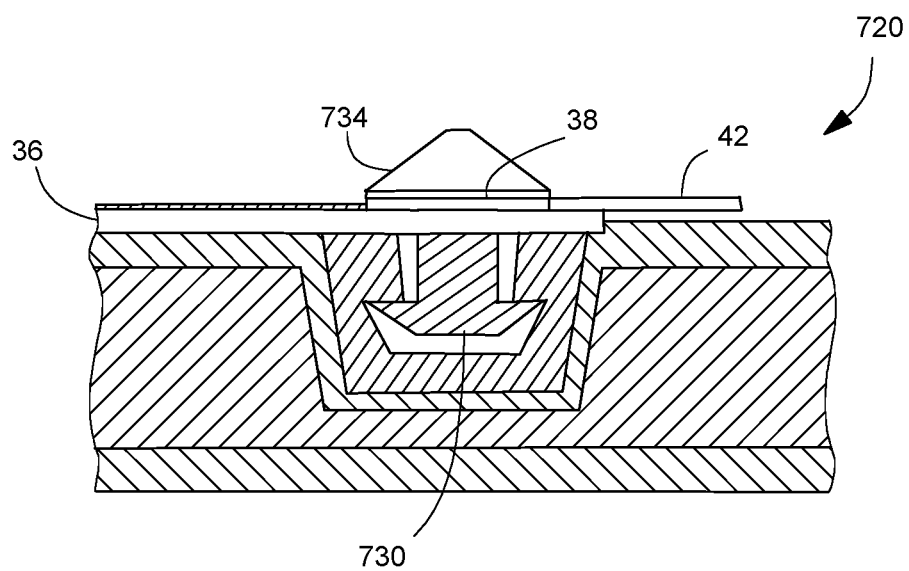
FIG. 10 is a schematic, partial cross section view through a portion of an electrical assembly, according to another embodiment.

FIG. 10 illustrates an alternate embodiment of FIG. 6. The assembly described in FIG. 10 has many items in common with that of FIG. 6 and so to avoid unnecessary repetition of the description that same reference numbers have been used; for those modified components, they are given a 700-series number. In this embodiment, the push pin 730 is plastic and a ring terminal 38, connected to the lead wire 42, is employed. The ring terminal 38 electrically connects to the conductive trace 36 under the second head 734. The rest of the electrical assembly 720 may be the same as in FIG. 6. In FIGS. 7-9, the alternative may also be to use a plastic push pin in combination with the ring terminal 38.

Figure 11:
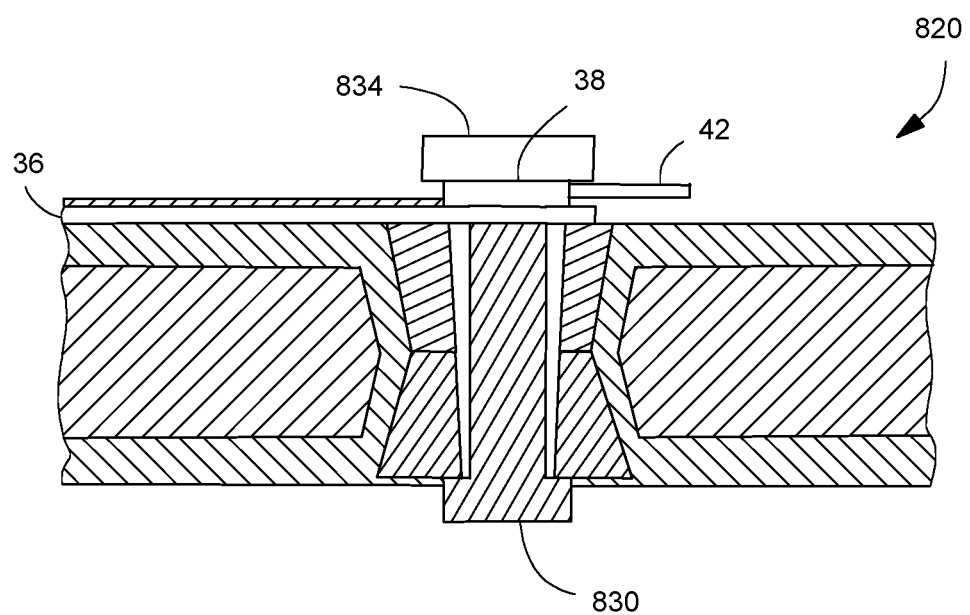
FIG. 11 is a schematic, partial cross section view through a portion of an electrical assembly, according to another embodiment.

FIG. 11 illustrates an alternate embodiment of FIG. 9. The assembly described in FIG. 11 has many items in common with that of FIG. 9 and so to avoid unnecessary repetition of the description that same reference numbers have been used; for those modified components, they are given an 800-series number. In this embodiment, a rivet 830 is employed rather than a push pin to hold the electrical assembly 820 together. Additionally, a ring terminal 38, is shown connected to the lead wire 42 (although this ring terminal 38 may be employed in FIG. 9 as well). The ring terminal 38 electrically connects to the conductive trace 36 under the second head 834. The rest of the electrical assembly 820 may be the same as in FIG. 6.

Figure 12:
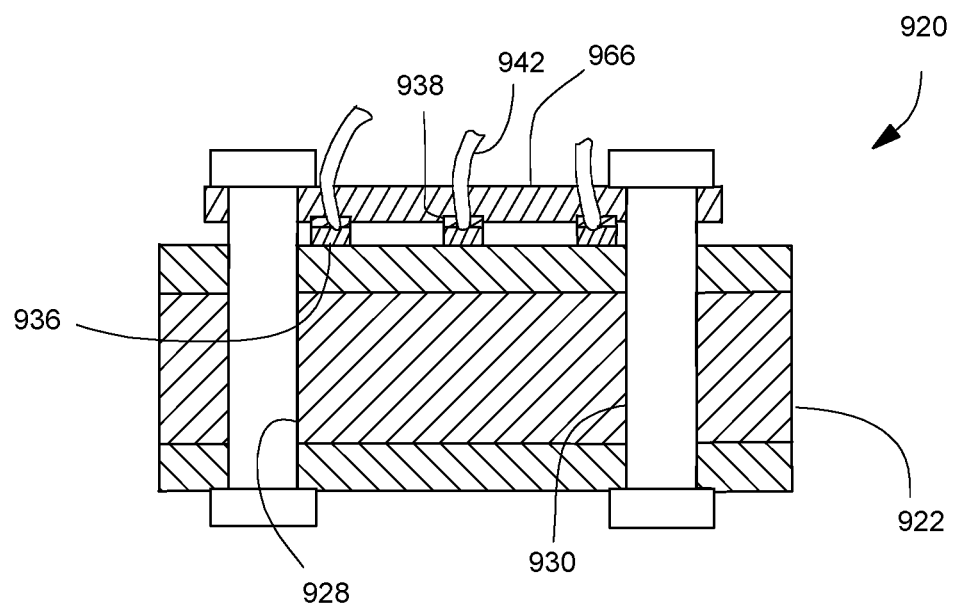
FIG. 12 is a schematic, partial cross section view through a portion of an electrical assembly, according to another embodiment.
Figure 13:
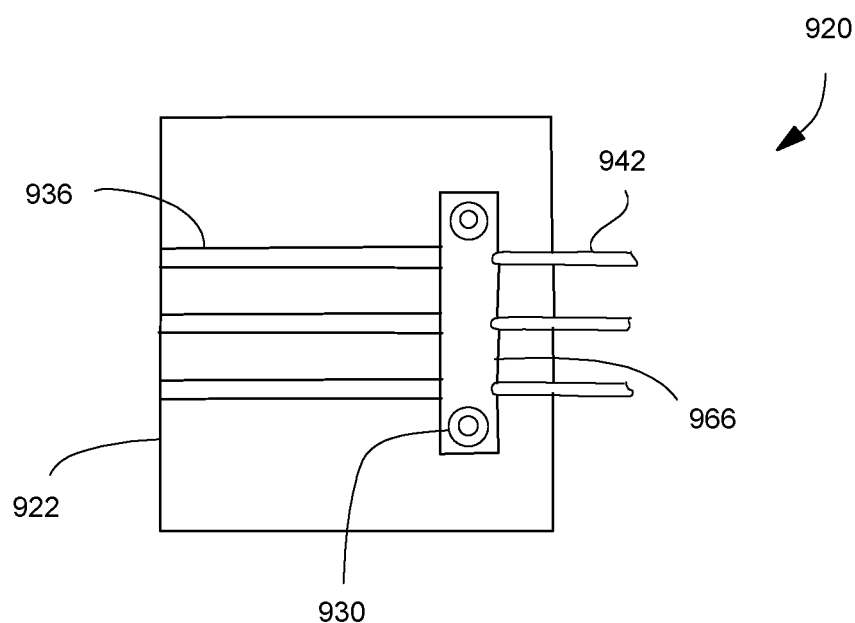
FIG. 13 is a schematic plan view of the embodiment of FIG. 12.

FIGS. 12 and 13 illustrate another alternate embodiment of the electrical assembly 920, with similar elements to previous embodiments given similar numbers, but in the 900-series. In this embodiment the substrate 922 has multiple conductive traces 936 mounted thereto in close proximity to each other. Additionally, the substrate 922 includes two holes 928 adjacent to and on opposed sides of the terminus of the conductive traces 936. Fasteners, such as rivets, 930 extend through the holes 928 and secure a connector bar 966, extending across the terminus of each conductive trace 936, to the substrate 922. Flat terminals 938 are each connected to a respective lead wire 942 and sandwiched between the connector bar 966 and a respective one of the conductive traces 936. The connector bar 966 is electrically insulating to insure that the electrical connection is between the desired conductive trace 936 and its corresponding flat terminal 938.

While certain embodiments of the present invention have been described in detail, those familiar with the art to which this invention relates will recognize various alternative designs and embodiments for practicing the invention as defined by the following claims.

The invention claimed is:

1. An electrical assembly comprising:
a substrate having an aperture;
a flat conductor mounted to the substrate and extending over at least a portion of the aperture;
a ring terminal in contact with the flat conductor adjacent to the aperture;
a round lead wire connected to the ring terminal;
a fastener extending through the ring terminal and flat conductor, secured in the aperture, and securing the ring terminal against the flat conductor, wherein the fastener is made of an electrically conducting material and an electrically non-conducting material is located in the aperture between the fastener and an electrically conducting portion of the substrate; and
wherein an anchor, which is electrically insulative, is mounted in the aperture and the fastener extends into a cavity in the anchor, and wherein an outer surface of the anchor is a truncated conical shape.

2. The electrical assembly of claim 1 wherein the aperture is a hole through the substrate and the fastener extends through at least a portion of the substrate.

3. The electrical assembly of claim 2 wherein the fastener is a rivet having a first head formed to secure the rivet to the substrate and a second head under which the flat conductor and the ring terminal are in contact.

4. The electrical assembly of claim 1 wherein the fastener is a push pin and includes a barb that engages with the anchor to retain the push pin in the substrate.

5. The electrical assembly of claim 1 wherein the fastener is a push pin having a head under which the flat conductor and the ring terminal are in contact, and at least one barb that secures the push pin in the substrate.

6. The electrical assembly of claim 1 wherein the substrate includes a metal vehicle body portion and paint coating the metal vehicle body portion.

7. The electrical assembly of claim 1 wherein the electrically non-conducting material located in the aperture is paint.

8. An electrical assembly comprising:
a substrate having an aperture;
a flat conductor mounted to the substrate;
a terminal in contact with the flat conductor adjacent to the aperture;
a round lead wire connected to the terminal; and
a fastener secured in the aperture, securing the terminal against the flat conductor, wherein the fastener is made of an electrically non-conducting material; and
wherein an anchor, which is electrically insulative, is mounted in the aperture and the fastener extends into a cavity in the anchor, and wherein an outer surface of the anchor is a truncated conical shape.

9. The electrical assembly of claim 8 wherein the outer surface of the anchor is shaped as back-to-back truncated conical shapes.

10. An electrical assembly comprising:
a substrate having an aperture;
a flat conductor mounted to the substrate and extending over at least a portion of the aperture;
a ring terminal in contact with the flat conductor adjacent to the aperture;
a round lead wire connected to the ring terminal;
a fastener extending through the ring terminal and flat conductor, secured in the aperture, and securing the ring terminal against the flat conductor, wherein the fastener is made of an electrically conducting material and an electrically non-conducting material is located in the aperture between the fastener and an electrically conducting portion of the substrate; and
wherein an anchor, which is electrically insulative, is mounted in the aperture and the fastener extends into a cavity in the anchor, and wherein an outer surface of the anchor is shaped as back-to-back truncated conical shapes.

* * * * *